(12) United States Patent
Lauf et al.

(10) Patent No.: US 6,821,474 B2
(45) Date of Patent: Nov. 23, 2004

(54) METHOD FOR PREPARING DIELECTRIC COMPOSITE MATERIALS

(75) Inventors: Robert J. Lauf, Oak Ridge, TN (US); Kimberly K. Anderson, Knoxville, TN (US); Frederick C. Montgomery, Oak Ridge, TN (US); Jack L. Collins, Knoxville, TN (US); John J. Felten, Chapel Hill, NC (US)

(73) Assignee: UT-Battelle, LLC, Oak Ridge, TN (US)

( * ) Notice: Subject to any disclaimer, the term of this patent is extended or adjusted under 35 U.S.C. 154(b) by 45 days.

(21) Appl. No.: 10/391,366

(22) Filed: Mar. 18, 2003

(65) Prior Publication Data

US 2004/0060730 A1 Apr. 1, 2004

Related U.S. Application Data

(62) Division of application No. 10/256,843, filed on Sep. 27, 2002, now Pat. No. 6,600,645.

(51) Int. Cl.$^7$ .............................. H05B 6/00; B28B 1/00
(52) U.S. Cl. ........................ 264/435; 264/614; 264/621
(58) Field of Search .......................... 264/14, 435, 615, 264/621

(56) References Cited

U.S. PATENT DOCUMENTS

| | | | | |
|---|---|---|---|---|
| 4,127,681 A | * | 11/1978 | Ferren et al. | ................ 427/100 |
| 4,661,301 A | * | 4/1987 | Okada et al. | ................. 264/41 |
| 5,062,993 A | | 11/1991 | Arnold, Jr. et al. | |
| 5,420,086 A | | 5/1995 | Brandau et al. | |
| 5,744,285 A | | 4/1998 | Felten et al. | |
| 5,759,228 A | | 6/1998 | Sisson et al. | |
| 5,785,789 A | * | 7/1998 | Gagnon et al. | ............. 156/235 |
| 5,821,186 A | | 10/1998 | Collins | |
| 6,042,936 A | * | 3/2000 | Kempf | ....................... 428/323 |

OTHER PUBLICATIONS

Shin–Ichi Hirano et al, "Preparation of Ba2Ti9O20 Ceramics by Hydrolysis of Metal Alkoxides." Multilayer Ceramic Devices. The American Ceramic Society. Inc. (Westerville, Ohio).

Paul A. Haas, "Formation of Uniform Liquid Drops by Application of Vibration to Laminar Jets." Ind. Eng. Chem. Res., p. 959–967. (1992).

* cited by examiner

Primary Examiner—Christopher A. Fiorilla
(74) Attorney, Agent, or Firm—Shelley L. Stafford

(57) ABSTRACT

The invention allows the fabrication of small, dense beads of dielectric materials with selected compositions, which are incorporated into a polymeric matrix for use in capacitors, filters, and the like. A porous, generally spherical bead of hydrous metal oxide containing titanium or zirconium is made by a sol-gel process to form a substantially rigid bead having a generally fine crystallite size and correspondingly finely distributed internal porosity. The resulting gel bead may be washed and hydrothermally reacted with a soluble alkaline earth salt (typically Ba or Sr) at elevated temperature and pressure to convert the bead into a mixed hydrous titanium- or zirconium-alkaline earth oxide while retaining the generally spherical shape. Alternatively, the gel bead may be made by coprecipitation. This mixed oxide bead is then washed, dried and calcined to produce the desired ($BaTiO_3$, $PbTiO_3$, $SrZrO_3$) structure. The sintered beads are incorporated into a selected polymer matrix. The resulting dielectric composite material may be electrically "poled" if desired.

16 Claims, 6 Drawing Sheets

METHOD FOR PREPARING DIELECTRIC COMPOSITE MATERIALS

CROSS REFERENCE TO RELATED APPLICATIONS

The present application is a divisional application of U.S. patent application Ser. No. 10/256,843, filed Sep. 27, 2002, now U.S. Pat. No. 6,600,645, entitled "Dielectric Composite Materials and Method for Preparing," incorporated herein by reference.

The invention was made with government support under contract no. DE-AC05-00OR22725 awarded by the United States Department of Energy to Lockheed Martin Energy Research Corporation; and the government has certain rights in the invention.

FIELD OF THE INVENTION

The present invention relates to the field of electronic devices and materials. More specifically, the present invention relates to dielectric composite materials having a polymeric matrix comprising dense ceramic beads dispersed therein and further relating to the methods for making the ceramic beads.

BACKGROUND OF THE INVENTION

In the field of electronic devices, there is a need for materials having a relatively high dielectric constant for passive circuit elements such as capacitors, filters, and the like. It is particularly desirable to have such materials in forms that comprise a polymer matrix (as a thin, flexible sheet or as a printable composition) in order to incorporate capacitive elements into polymer thick-film circuits and other low-cost electronic assembly methods. The simple incorporation of dielectric powder, such as barium titanate, into a polymer binder is limited to some degree by the volume fraction of powder that can be incorporated while maintaining adequate fluidity or workability of the material. This can be alleviated to some degree by proper control of particle size distribution (J. J. Felten, U.S. Pat. No. 5,744,285). It would be useful to have a material that has a high dielectric constant wherein the material comprises dense, ceramic microspheres that could easily be controlled and manipulated to solve many of these problems.

OBJECTS OF THE INVENTION

Accordingly, it is an object of the present invention to produce spherical beads of ceramic dielectrics for passive electronic devices.

It is another object of the present invention to produce large numbers of substantially mono-sized dielectric beads for incorporation into a polymer matrix or coating.

It is yet another object of the present invention to produce dielectric beads containing selected dopants to modify the dielectric properties.

It is a further object of the present invention to produce dielectric beads by hydrothermal reaction of titanium oxide ($TiO_2$) or zirconium oxide ($ZrO_2$) with selected soluble salts, particularly alkaline earths.

It is still yet a further object of the present invention to produce polymeric films having ceramic dielectric beads dispersed therein.

It is another object of the present invention to produce polymeric films having dispersed ceramic dielectric beads that are capable of being electrically poled.

It is a further object of the present invention to produce capacitors and filters in which the dielectric medium is a polymer composite comprising dense dielectric beads.

Further and other objects of the present invention will become apparent from the description contained herein.

SUMMARY OF THE INVENTION

In accordance with one aspect of the present invention, the foregoing and other objects are achieved by a dielectric medium comprising a polymeric matrix having ceramic spherical beads dispersed therein, wherein the spherical beads have a substantially high density and wherein the polymeric matrix has a dielectric constant <20 and the spherical beads have a dielectric constant >100.

In accordance with another aspect of the present invention, other objects are achieved by an electrical capacitor comprising a dielectric medium disposed between two conductive electrodes wherein the dielectric medium comprises a polymeric matrix having sintered ceramic spherical beads dispersed therein. The spherical beads have a substantially high density and the polymeric matrix has a dielectric constant <20 and the spherical beads have a dielectric constant >100.

In accordance with yet another aspect of the present invention, other objects are achieved by a prefired ceramic dielectric for polymer thick-film capacitors comprising a polymeric matrix having sintered ceramic spherical beads dispersed therein. The spherical beads have a substantially high density and the polymeric matrix has a dielectric constant <20 and the spherical beads have a dielectric constant >100.

In accordance with still yet another aspect of the present invention, other objects are achieved by a method for making a dielectric composite material comprising the steps of forming spherical hydrous metal oxide beads by a sol gel process wherein the beads comprise at least one Group IVb metal species. Then calcining the beads to form sinterable, spherical beads and sintering the spherical beads to a desired density and a desired grain size. Then dispersing the beads in a polymer matrix to form a dielectric composite material.

In accordance with another aspect of the present invention, other objects are achieved by a method for making an electrical capacitor comprising the steps of forming spherical hydrous metal oxide beads by a sol gel process wherein the beads comprise at least on Group IVb metal species. Then calcining the beads to form sinterable spherical beads and sintering the spherical beads to a desired density and a desired grain size. Then dispersing the beads in a polymer matrix to form a planar dielectric composite material and applying electrodes to opposite surfaces of the dielectric composite material.

DETAILED DESCRIPTION OF THE INVENTION

Figure 1:
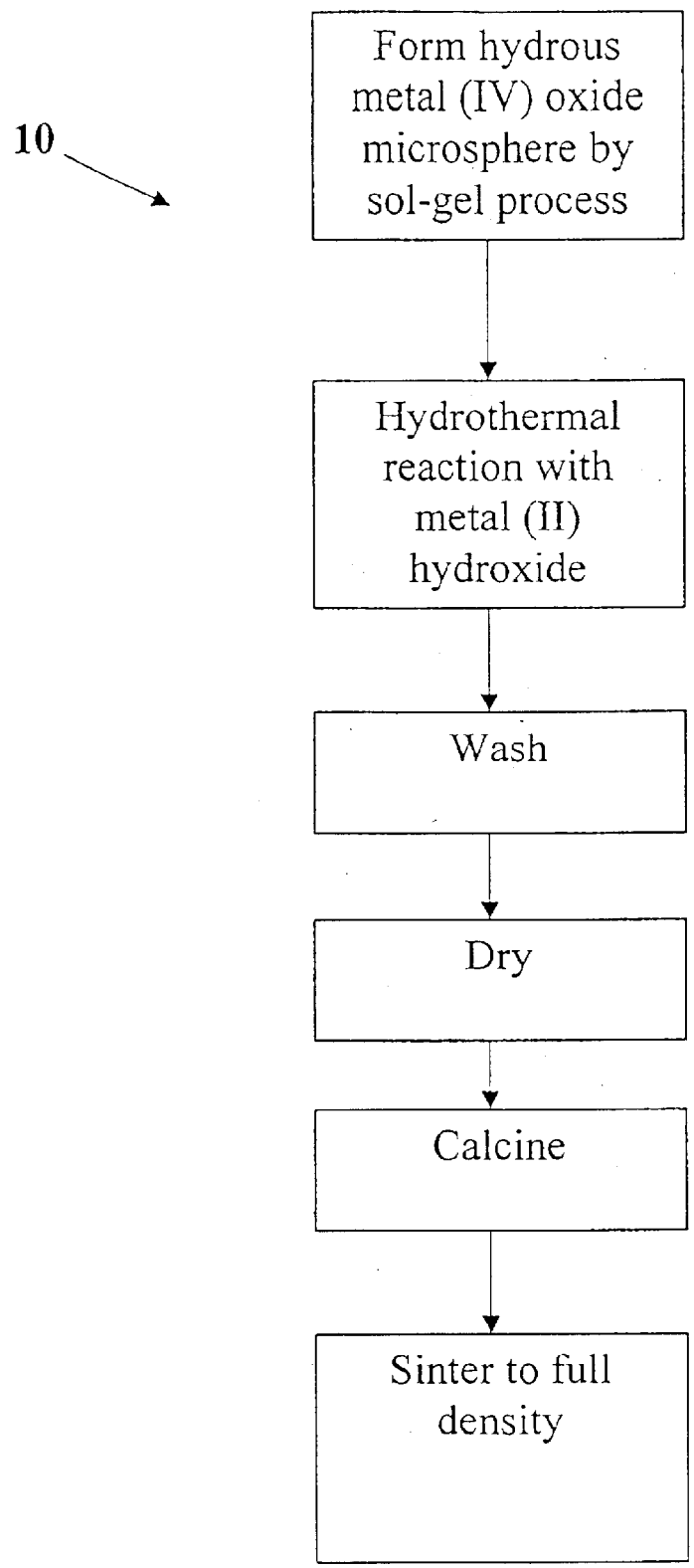
FIG. 1 is a schematic diagram of an internal gelation process used to make the dielectric beads of the present invention.

The present invention is designed to allow the fabrication of small, dense, generally spherical beads of dielectrics with selected compositions for use in passive electrical devices such as capacitors, filters, and the like. It is contemplated that the beads described and claimed in the present invention are sintered to as high a density as possible. High density not only makes the beads stronger and less susceptible to breakage during further processing, but it also allows one to maximize the amount of high-dielectric material incorporated into the composite material. Thus, the sintered density of the beads of the present invention is preferably greater than 80% and more preferably greater than about 95%. The spherical beads are polycrystalline, both as formed and after sintering. The spherical dielectric beads of the subject invention are preferably formed from porous, generally spherical beads of hydrous titanium or zirconium oxide made by a sol-gel process to form substantially rigid beads having a generally fine crystallite size and correspondingly finely distributed internal porosity. The resulting gel bead is washed and hydrothermally reacted with a soluble alkaline earth salt such as barium, lead or strontium, under conditions of elevated temperature and pressure to convert the bead into a mixed hydrous titanium- or zirconium-alkaline earth oxide while retaining the generally spherical shape. This mixed oxide bead is then washed, dried, and calcined to produce the desired ($BaTiO_3$ or $SrZrO_3$) crystal structure. Alternatively, the gel beads may also be made by a coprecipitation route using many of the same process steps but eliminating the hydrothermal conversion step. The calcined bead is then sintered to form a dense bead of the dielectric phase suitable for incorporation into a polymer matrix for various electronic devices and components. The composite material may be poled after fabrication in order to increase the effective dielectric constant of the material.

The beads of the present invention may be small to the naked eye (e.g., 10 $\mu$m average diameter) but it will be appreciated that they are substantially different from precipitated powders (as described, for instance, by Hirano et al., "Preparation of $Ba_2Ti_9O_{20}$ Ceramics by Hydrolysis of Metal Alkoxides," Adv. In Ceramics 19, 139–46 (1980) even though the individual powder particles might also have a generally spheroidal shape. The points of distinction are:
1. The "spheroidal powder particles" are much smaller, typically 0.2 $\mu$m. The "beads" of the present invention are generally larger than about 10 $\mu$m.
2. Spheroidal powders are too fine to conveniently disperse in a polymer matrix and are instead intended to be consolidated into a dense monolithic body by conventional ceramic processing routes, at which point they will have lost all of their original spheroidal structure.
3. Powder particles are usually small single crystals. The beads of the present invention are polycrystalline, both as formed and after sintering.

Those skilled in the art will readily appreciate that the inventive dielectric beads, even at the smallest size range contemplated, are clearly different from sinterable "powders" even though the powders may in some cases have a generally spheroidal shape before consolidation and sintering.

A porous, generally spherical bead of hydrous titanium or zirconium oxide is made by a sol-gel process in which an aqueous droplet containing soluble titanium or zirconium is placed into a surrounding non-aqueous fluid medium, wherein surface tension causes the droplet to assume a nearly perfect spherical shape. A chemical reaction causes the precipitation of hydrous titanium or zirconium oxide, followed by gelation of this oxide to form a substantially rigid bead having a generally fine crystallite size and correspondingly finely distributed internal porosity. The resulting gel bead is washed and placed into a hydrothermal reactor with a soluble alkaline earth salt (such as barium, lead or strontium) and reacted under conditions of elevated temperature and pressure to convert the bead into a mixed hydrous titanium- or zirconium-alkaline earth oxide while retaining the generally spherical shape. This mixed oxide bead is then washed, dried, and calcined to produce a desired (e.g., $BaTiO_3$) crystal structure. The calcined bead is then sintered to form a dense bead, for example of the $BaTiO_3$ phase, suitable for incorporation into various electrical devices and components. The composite material may be poled after fabrication in order to increase the effective dielectric constant of the material.

The dense spherical beads can be used in materials such as a polymer matrix as a thin, flexible sheet or as a printable composition. The dense spherical beads making up the printable composition may have diameters that are about equal to the final film thickness, allowing them to be dispersed into a mono-layer and easily contacted by electrodes on both sides of the film. These spheres can be easily poled to increase capacitance of the device. Alternatively, three sizes of dense spheres can be blended in order to get very high solids loading (perhaps as high as 96%) while keeping a substantially fluid mixture for ease of printing or film extrusion. The dielectric spheres can also be dispersed in a fluid medium to create a dielectric liquid having greatly increased dielectric constant compared to pure fluorocarbon or hydrocarbon dielectric liquids; at the same time, the spheres are large enough to prevent unwanted agglomeration or electrorheological behavior. The beads of the present invention have an average diameter of about 10 $\mu$m and larger. The unique properties of larger diameter and the polycrystalline structure (both as formed and after sintering) of these dielectric beads of the present invention substantially distinguish the spherical beads of the present invention from spheroidal powder particles described in the literature.

One particularly suitable method for making precursor materials of hydrous titanium oxide gel bead or the hydrous zirconium oxide gel beads for use in the present invention is an internal gelation process generally taught by Collins in U.S. Pat. No. 5,821,186, incorporated herein by reference. Other suitable methods include external gelation (see U.S. Pat. No. 5,420,086 by Brandau et. al., for a description of external gelation processes and chemistries, incorporated herein by reference), coprecipitation, water extraction (see for example, U.S. Pat. No. 5,062,993 by Arnold et al., describing the method of injecting droplets of an aqueous metal oxide sol into a "forming solution" of 2-ethylhexanol, incorporated herein by reference), alkoxide processes, and others as are well known in the field of inorganic synthesis of ceramic materials.

In one preferred embodiment of the present invention, the hydrous titanium oxide gel bead or the hydrous zirconium oxide gel bead is made by an internal gelation process in which a chilled broth containing acidified titanium tetrachloride, an organic base such as hexamethylenetetramine (HMTA), and a complexing agent such as urea is injected into a heated column of silicone oil (Dow Corning Silicone Fluid 200). Heating causes hydrolysis reactions to occur, whereby hydrous titanium oxide precipitates within the injected droplets as colloidal particles, which gel to form a rigid, porous bead during the residence time in the column. This preferred embodiment for making the hydrous titanium oxide gel beads or hydrous zirconium oxide gel beads uses optimum formulations and conditions. These optimum formulations and conditions create an optimum process parameter window. The initial concentrations of the listed constituents in the broth and the order of mixing these chemicals are important. By controlling the parameters of the broth and the reactions, it is possible to affect the final characteristics of the gel, such as size, shape, porosity and density. The key parameters of this method for making these hydrous titanium oxide or hydrous zirconium oxide gel beads include concentrations of the constituents of the broth, broth stability, reaction temperature, gelation and the structure and chemical composition of gels formed. The constituent concentrations influence the broth stability, gelation times and types of gels. This bead is then washed and placed into a sealed container where it is hydrothermally reacted with an alkaline earth (typically Ba) to form a mixed hydrous oxide while retaining its spherical shape. This mixed oxide is calcined and sintered to form a dense spherical bead of the desired phase (generally $BaTiO_3$ or its analogues).

The four principal reactions involved in preparing hydrous titanium oxide from chilled broths containing acidified titanium tetrachloride, HMTA, and urea is shown as follows:

Complexation/Decomplexation,

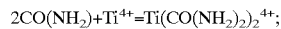

$$2CO(NH_2)+Ti^{4+}=Ti(CO(NH_2)_2)_2^{4+};$$

hydrolysis,

$$Ti^{4+}+xH_2O=Ti(OH)_4 \cdot yH_2O+4H^+ \text{ and}$$

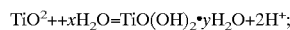

$$TiO^{2+}+xH_2O=TiO(OH)_2 \cdot yH_2O+2H^+;$$

HMTA Protonation,

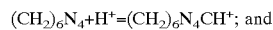

$$(CH_2)_6N_4+H^+=(CH_2)_6N_4CH^+; \text{ and}$$

HMTA Decomposition,

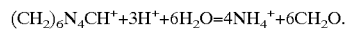

$$(CH_2)_6N_4CH^++3H^++6H_2O=4NH_4^++6CH_2O.$$

The major constituents for most broths used for making microspheres of hydrous metal oxide are HMTA, urea and a metal salt. Urea serves as a complexing agent for the metal (reaction 1) and at certain concentrations allows for stable broths to be prepared at ~0° C. that remain clear and free of gelation or precipitation for reasonable periods of time. As the temperature of the broth droplets rises in the hot organic medium, decomplexation occurs (reaction 1) and thus allows hydrolysis of the titanium (reaction 2). HMTA, a weak organic base, drives the hydrolysis reaction to completion. At first, the HMTA molecules are singularly protonated (reaction 3). After most of the HMTA molecules (~95%) are protonated; however, they begin to decompose (reaction 4) into ammonium ions, which make the system even more basic. Each protonated HMTA molecule can effectively remove three additional hydrogen ions. The reaction products are ammonium chloride and formaldehyde. In addition to being a complexing agent, urea also functions as a catalytic agent in the decomposition of protonated HMTA molecules.

In another preferred embodiment, a hydrous mixed oxide gel bead is made by an internal gelation process using a chilled broth containing soluble $Ti^{+4}$, $Zr^{+4}$, or $Hf^{+4}$ and one or more additional metals in soluble form, preferably lead or one of the lanthanide elements. This broth is injected into a heated column of silicone oil. Heating causes reactions to occur analogous to those described above, whereby a hydrous mixed oxide precipitates as colloidal particles, which gel to form a rigid, porous bead during the residence time in the column. This bead is washed and dried, and then calcined and sintered to form a dense spherical bead of the desired phase (such as $PbTiO_3$, $PbZrO_3$ or various rare earth titanates and their analogues).

In another preferred embodiment, a dielectric phase is produced by coprecipitation in an aqueous droplet while the droplet is suspended in an immiscible medium such as silicone oil. This embodiment is particularly suitable for making compounds such as lead titanate or rare-earth perovskite compounds by a sol-gel or alkoxide route.

In another preferred embodiment, a hydrous mixed oxide gel bead is made by an alkoxide process. This method is based on the hydrolysis of alkoxides in a droplet of Dowanol® PM (propylene glycol monomethyl ether) suspended in mineral oil. A solution of lead acetate trihydrate and titanium isopropoxide dissolved in Dowanol® PM (propylene glycol monomethyl ether) (Dow Chemical, Midland Mich.) was partially hydrolyzed by addition of water at a water:OR ligand ratio between 1 and 2. The partially hydrolyzed solution was added dropwise to stirred mineral oil heated to about 90° C. forming hydrous Pb—Ti—O gel beads.

FIG. 1 illustrates schematically a preferred embodiment of the basic chemical flow chart 10 of the present invention using an internal gelation process. Applicable gelation processes are internal gelation, external gelation, and water extraction, although internal gelation is the most preferable process.

Figures 2, 2A:
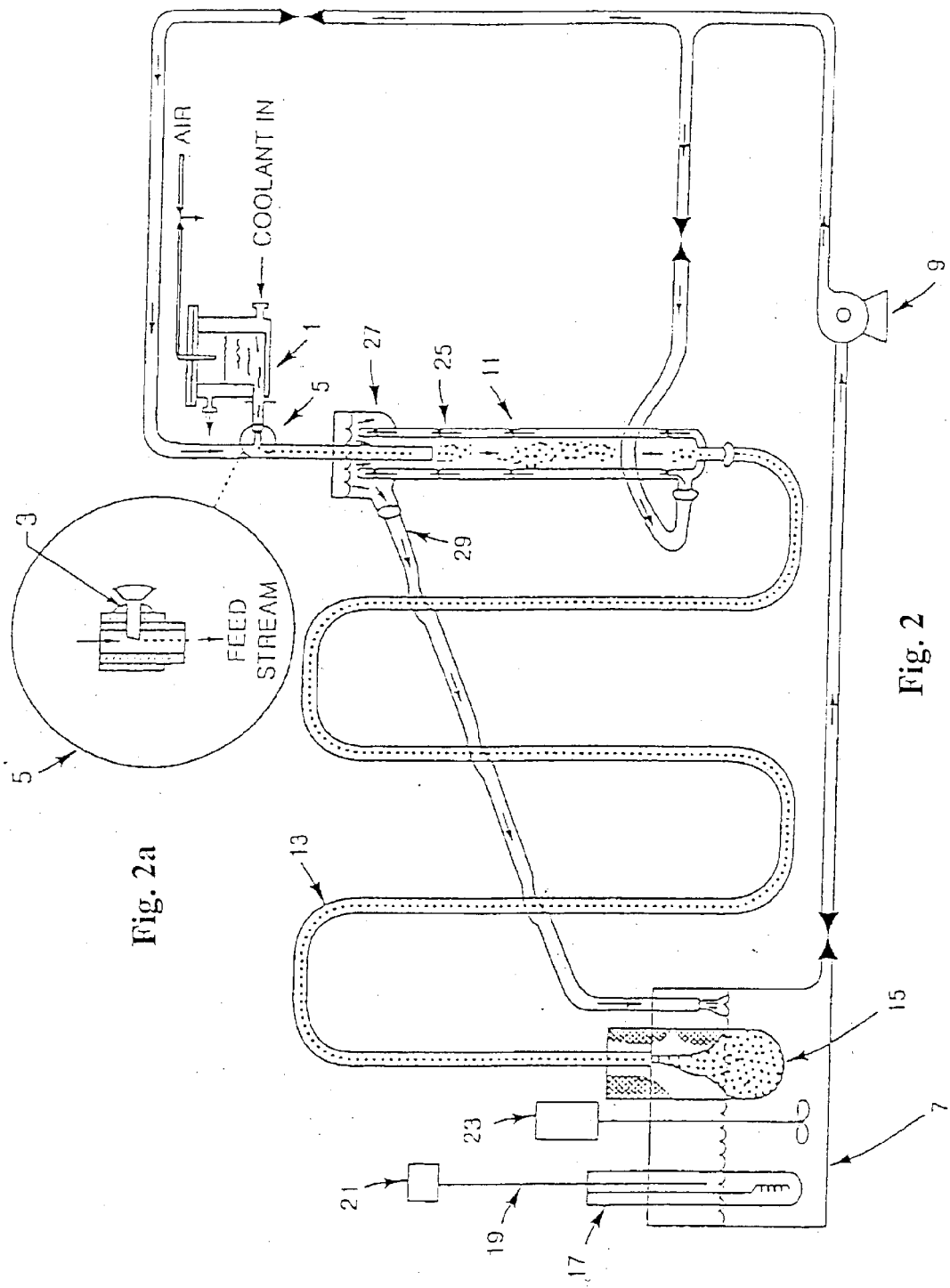
FIGS. 2 and 2a are a schematic diagram of an apparatus suitable for mass producing the dielectric beads of the present invention in a continuous or semi-continuous manner.

Illustrated in FIG. 2 and FIG. 2a is one embodiment of an apparatus that is suitable for carrying out the gelation step of the present invention. In this embodiment, the chilled broth is injected through a needle 3 into a column 11 of silicone oil that is continuously recirculating from a heated reservoir 7. The broth droplets gel during their residence time in a downstream transport line 13 and are collected in a basket 15 for washing.

FIG. 2 illustrates a chilled broth is first formed and then added to the chilled apparatus broth pot 1 and processed through the gel-forming or spherule-forming apparatus. The system also includes a needle 3 that is used in a two-fluid nozzle 5 for placing broth droplets in the hot organic medium where they gel. The apparatus also includes a reservoir 7 for heating the organic medium, a pump 9 for circulating the organic medium, a chilled broth pot 1, a two-fluid nozzle system 5 for controlling the size of the broth droplets, a glass gelation column (forming column) 11, a downstream transport line 13 to provide a residence time for the gel spherules to hydrolyze and solidify, and a product collector 15 for collecting and aging the gelled spherules and also for separating the organic medium from the gelled spherules.

The organic medium reservoir 7 may comprise a stainless steel open-top rectangular container. One or more heating blades 17 may be positioned at the rear of the reservoir to heat the organic medium. A thermocouple 19 may be positioned in the basket at the bottom and near the front of the reservoir and is connected to a temperature controller 21 that is used to control the organic medium temperature. A stirrer 23 with its shaft positioned away from the heating blade or blades 17 (other blades not shown) and its impeller located near the bottom of the reservoir is used to mix and maintain the organic medium at a desired temperature. Occupying most of the front space in the reservoir 7 is a large removable basket 15 that serves as a backup to prevent any spilled gelled spherules from being pumped out of the reservoir to the circulating pump.

The pump 9 is used to pump the hot organic medium from the reservoir 7 through a line to the vertically positioned glass gelation column 11. The flow from the pump 9 is divided into two streams that are controlled by manual valves. The flow of one of the streams may be routed to a position above the center of the top of the gelation column 11. Vertically attached to this line may be a tube whose outlet end is inserted into the entrance of the gelation column. The tube is part of the two-fluid nozzle 5 system that is used to control the size of the droplets. The other hot organic medium stream from the pump 9 is routed to a fitting at the bottom of the gelation column 11 and flows up through a shell 25 that surrounds the gelation column 1. The hot organic medium over-flows at the top of the column, first, into the gelation column 11 and, then, into an overflow cup 27. A large tube 29 is connected to a fitting from the overflow cup 27 to route any overflow back to the hot organic medium reservoir 7. During operation, the flow of organic medium from the heating shell 25 is normally adjusted to provide only a slight overflow.

As shown in FIG. 2a, the two-fluid nozzle system 5 is very simple. It comprises a needle 3 that is perpendicularly inserted through the wall of the tube to the midpoint of the hot organic medium carrier stream and is positioned approximately 5 inches above the entrance to the gelation column 11. The chilled broth is jetted into the laminar flowing oil by air pressurizing the broth pot 1, forcing the broth out a tube at the bottom of the broth pot through a short plastic line that is connected to the needle 3. The size of the droplets formed is dependent upon the gauge of the needle used and the flow rates of the hot organic medium and of the broth.

The hot organic medium carrying the droplets from the two-fluid nozzle tube 5 flows directly into the central concurrent flow tube of the jacketed gelation column 11 where it is desirable for the droplets to begin to gel. On exiting the gelation column 11, the gelling spheres flow into a serpentine transport line 13. This line is long enough (about 8-ft.) to allow the gelling spherules to have a total residence time of 25 to 35 seconds to the collection basket 15. The transport time also includes the time the spherules are passing through the gelation column. The gelation column and serpentine transport system are designed to be a siphoning system with a gravity head of about 60-cm for oil temperatures in the range of about 45° to 100° C.

The collection basket 15 is positioned above the hot organic medium reservoir 7, and is used to collect and separate the gel spherules from the hot organic medium as they exit the serpentine transport line 13. The collected gel spherules are aged by lowering the collection basket 15 into the reservoir 7 for between 15 and 30 minutes, preferably 20 minutes. After aging, the bulk of the organic medium is drained from the gel spherules and the residual organic medium is removed by a series of washing steps to remove the reaction impurities.

Another basket of similar design may also be positioned above the hot oil reservoir to filter the return organic medium from a tube, which is connected to the overflow drain line at the top of the gelation column.

Conversion of the hydrous titanium oxide gel beads is carried out in a Parr reactor by first allowing the wet microspheres to equilibrate overnight in a solution of the hydroxide at the same concentration that will be used for hydrothermal treatment. After equilibration, the beads are placed in a stainless steel mesh basket and suspended in the reactor vessel with enough excess hydroxide solution to provide about a 50% volume head. The vessel is sealed and then heated to a desired temperature and held for a desired time, typically several hours.

As will be illustrated in the following examples, the aforedescribed method can be carried out in a wide range of modifications to selectively synthesize beads having selected compositions and therefore selected dielectric properties.

EXAMPLE 1

The apparatus shown in FIG. 2 and FIG. 2a was used to make hydrous titanium oxide gel beads by the internal gelation process in accordance with U.S. Pat. No. 5,821,186, incorporated herein by reference. A broth containing containing acidified titanium tetrachloride (1.64 M Ti in 2.25 M HCl), 3.09 M HMTA, and 3.09 M urea was made up to achieve the following targets:

Mole ratio of HMTA/Ti 2.32
Mole ratio of urea/Ti=2.32
Ti concentration=78.56 g/L A batch consisting of 80 mL of Ti solution, 41.25 mL deionized water, 92.3 mL of HMTA/urea solution was chilled and placed into the reservoir. The broth was injected into the silicone oil (Dow Corning 200) through an 18 gauge needle, forming droplets about 500 μm in diameter. Residence time of the droplets in the column was about 0.5 minutes, after which the resulting gel spheres had sufficient rigidity to collect them in the basket. The gel spheres were allowed to age for about 15 minutes in the basket, after which they were washed in trichloroethylene and dilute ammonium hydroxide and then stored in deionized water.

It will be clear to those skilled in the art that the size of the gel beads can be controlled by the diameter of the nozzle used to inject the broth, as well as by other commonly known techniques such as ultrasonic agitation (P. A. Haas, "Formation of Uniform Liquid Drops by the Application of Vibration to Laminar Jets," Ind. Eng. Chem. Res. 31(3), 959–67 (1992), incorporated herein by reference.). Alternatively, the application of electric fields (W. G. Sisson et al., U.S. Pat. No. 5,759,228 Nozzle for Electric Dispersion Reactor (1998), incorporated herein by reference) may also be used to control droplet size. It will further be clear that the density of the gel beads (i.e., the volume fraction solids) can be controlled by the concentration of metal species in the feed broth and that the volume fraction solids will control the amount of shrinkage that the beads undergo during sintering. It can thus be appreciated that beads of virtually any desired size (from tens to thousands of μm) can be made by the process described

EXAMPLE 2

The hydrous titanium oxide gel beads from the previous Example were about 500 μm. These beads were suspended in a stainless steel mesh basket and placed into a Parr reactor in a solution of 0.1 M Ba(OH)$_2$ after overnight equilibration. Additional solution was used that included Ba(NO$_3$)$_2$ so that there was about 27 g of excess Ba(NO$_3$)$_2$, corresponding to a 3:1 ratio of Ba:Ti by weight. The reactor was heated to 150° C. while maintaining sufficient pressure to prevent boiling of the solution and the sample was held for 6 hours. Upon removal, the beads were intact and had changed color (white to tan). The beads were dried and fired in air by heating at 110° C./min to 1200° C. and held for 1 min at 1200° C. The beads, some of which were cracked and some of which were still intact, were then crushed and examined by X-ray diffraction, which determined that they were substantially single-phase $BaTi_4O_9$.

EXAMPLE 3

A second conversion experiment was done using conditions similar to those in Example 2. Again, excess barium nitrate was added to achieve a Ba:Ti ratio of 3:1. Conversion was carried out for 8.5 h at 150° C. Upon removal, the beads were intact and had changed color (to medium brown). The beads were dried and fired in air by heating at 10° C./min to 1200° C. and held for 1 min at 1200° C. The beads, about 80% of that were intact, were about 100 to 150 $\mu$m in diameter.

EXAMPLE 4

Another conversion experiment was done using conditions similar to those in Example 3, except that the gel beads were suspended in a Pyrex container. In this case, excess barium nitrate was added to achieve a Ba:Ti ratio of 4:1. Conversion was carried out for 9 h at 215° C. Upon removal, the beads were intact and had changed color (to medium brown). The beads were dried and fired in air by heating at 10° C./min to 1200° C. and held for 1 min at 1200° C. The beads, about 70% of that were intact, were about 100 to 150 $\mu$m in diameter. Some beads were then crushed and examined by X-ray diffraction, which determined that they were substantially single-phase $BaTi_5O_{11}$.

EXAMPLE 5

Another conversion experiment was done using conditions similar to those in Example 3. In this case, 0.5M $Ba(OH)_2$ was used as the hydrothermal solution. Conversion was carried out for 4 h at 200° C. The beads were dried and fired in air by heating at 2.5° C./min to 1200° C. and held for 1 min at 1200° C. Some beads were then crushed and examined by X-ray diffraction, which determined that they were substantially single-phase $BaTiO_3$.

EXAMPLE 6

The inventive process can be further modified to produce selected dielectric phases such as lead titanate by coprecipitation, thereby eliminating the hydrothermal treatment step. A solution was prepared using 40 mL of deionized water and 42.68 g of lead acetate and heated to fully dissolve the lead acetate. This solution was added to a broth containing 80 mL of chilled Ti stock solution, and 96.5 mL HMTA/urea stock solution as described previously. Upon mixing, a precipitate was formed (owing to the low solubility of the lead acetate). This mixture was added dropwise into the heated silicone oil (92° C.) to form Pb—Ti—O gel beads. These were allowed to age as described in Example 1, and then washed and dried as before. This material was dried and calcined at 800° C. and XRD showed that the $PbTi_3O_7$ phase was obtained.

EXAMPLE 7

A similar coprecipitation test was done as described in Example 6 but using $Pb(NO_3)_2$ with a target Pb:Ti ratio of 1:1. This material was determined to be the $PbTi_3O_7$ phase after calcining at 800° C. These results suggest that the material was not the desired 1:1 stoichiometry, perhaps because the limited solubility of Pb caused nonuniform precipitation when the lead salt was added to the chilled broth.

EXAMPLE 8

Many dielectric compositions have been developed for various purposes. For example, compositions based on rare earth titanates (e.g., $NdTiO_3$ and modifications thereof) do not have as high a dielectric constant as barium titanate, but are used when a very low temperature coefficient is needed. These formulations may be prepared in a manner analogous to the process described in Example 1 by substituting $Nd(NO_3)_3.6H_2O$ for some of the $TiCl_4$ in the appropriate molar ratio.

EXAMPLE 9

We also conducted preliminary tests of an alternative technique to make dielectrics such as lead titanate. This method is based on the hydrolysis of alkoxides in a droplet of Dowanol® PM (propylene glycol monomethyl ether) suspended in mineral oil. A solution of lead acetate trihydrate and titanium isopropoxide dissolved in Dowanul® PM (propylene glycol monomethyl ether) was partially hydrolyzed by addition of water at a water:OR ligand ratio between 1 and 2. The partially hydrolyzed solution was added dropwise to stirred mineral oil heated to about 90° C. This process initially yielded well-formed gel spheres of mixed land-titanium oxide but as the spheres aged, they agglomerated resulting in a thick mass. After drying the mass and calcining at 700° C. we obtained lead titanate, which as shown by x-ray diffraction was predominately in the Macedonite Structure. It is clear that with a larger process vessel and longer aging of the beads, this process yields well-formed gel spheres of mixed lead-titanium oxide suitable for further processing.

The importance of this observation is that it demonstrates that the inventive dielectric composites (dense ceramic beads suspended in a polymer matrix) can be made by a variety of routes with dielectric ceramics of many useful compositions.

All of the exemplary results are summarized in the following table:

TABLE 1

Summary of Dielectric Material Preparatious[a]

| Gel Composition | Conversion | Sintering | Phases/Comments |
|---|---|---|---|
| HtiO[b] | None | 10°/min to 1000° C., hold 1 min | Rutile; cracked beads 125–175 $\mu$m |
| HtiO[b] | None | 5°C./min to 100, hold 1 hr, 10° C./min to 700° C. | Anatase |
| HtiO[b] | 0.1 M $Ba(OH)_2$ + added $Ba(NO_3)_2$ for Ba:Ti = 3:1 6 h at 150° C. | 10°/min to 1200° C., hold 1 min | $BaTi_4O_9$; about 50% cracked |
| HtiO[b] | 0.1 M $Ba(OH)_2$ + added $Ba(NO_3)_2$ for Ba:Ti = 4:1 9 h at 215° C. | 10°/min to 1000° C., hold 1 min | $BaTi_5O_{11}$; about 50% cracked |
| HtiO[b] | 0.1 M $Ba(OH)_2$ + added $Ba(NO_3)_2$ for Ba:Ti = 3:1 | 10°/min to 1200° C., | About 20% cracked; beads |

TABLE 1-continued

Summary of Dielectric Material Preparations[a]

| Gel Composition | Conversion | Sintering | Phases/ Comments |
|---|---|---|---|
| HtiO[b] | 8.5 h at 150° C. 0.1 M Ba(OH)$_2$ + added Ba(NO$_3$)$_2$ for Ba:Ti = 4:1 9 h at 215° C. | hold 1 min 10°/min to 1200° C., hold 1 min | ~100–250 μm BaTi$_5$O$_{11}$; about 30% cracked |
| HtiO[b] | 0.5 M Ba(OH)$_2$ 4 hr at 200° C. | 2.5°/min to 1200° C., hold 1 min | BaTiO$_3$ + minor unknown phase |
| Pb—Ti—O[c] gelled as spheres but agglomerated during aging in the oil | None | Calcined 800° C. | PbTi$_3$O$_7$ |
| Pb—Ti—O[d] some spheres, a lot of agglomeration | None | Calcined 800° C. | PbTi$_3$O$_7$ |
| Pb—Ti—O[e] better formation of beads | None | Calcined 700° C. | PbTiO$_3$ |

[a]Summary of about 30 separate drying, calcining, and sintering experiments
[b]Hydrous titanium oxide microspheres were made as described in [1].
[c]Lead acetate trihydrate and titanium isopropoxide dissolved in Dowanol ® PM (propylene glycol monomethyl ether): hydrolyzed as droplets in stirred mineral oil at 90° C.
[d]Coprecipitation from titanium chloride and lead nitrate with HMTA/urea by injecting solution into silicone oil at about 92° C.
[e]Coprecipitation from titanium chloride and lead acetate with HMTA/urea by injecting solution into silicone oil at about 92° C.

It will be understood that the inventive process may be further modified by the addition of various dopants and modifiers as are well known in the art. As illustrated by the foregoing examples, compositional modifications can be incorporated either into the gelation process by coprecipitation (in the case of additives such as Pb, Nb, rare earths, and transition-metals that will form insoluble hydrous oxides) or into the hydrothermal step (in the case of soluble species such as Mg, Ca, Sr, etc.).

It will be appreciated that Applicants' material and method may be employed for a very wide variety of applications. These include primarily capacitors and filters, but the inventive materials can be used for any application where it is desired to have a polymeric material with a high dielectric constant.

Figure 3:
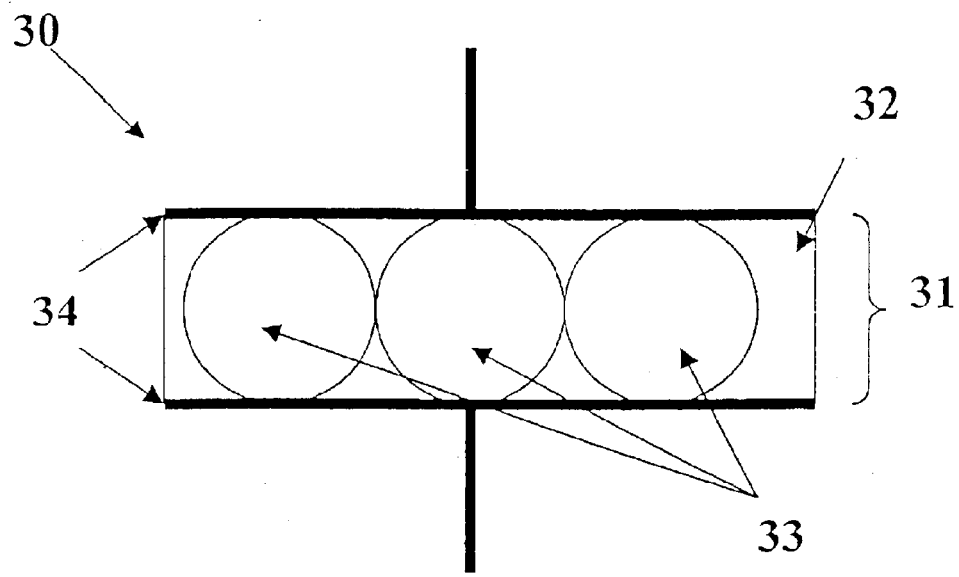
FIG. 3 illustrates a device employing the dielectric beads of the present invention as a single layer of substantially mono-sized beads.

Shown in FIG. 3 is one useful embodiment of the inventive material to form a capacitor 30 whereby a dielectric composite material 31 is a dielectric medium comprising a polymeric matrix 32 having a monolayer of ceramic beads 33 arranged between two electrodes 34. The composite material 31 may be made in bulk as a flexible polymer tape by well-known tape-casting or "doctor blade" techniques and diced or slit to convenient sizes. The electrodes may be applied to this tape either before or after dicing. Alternatively, if a large capacitance is needed, a long length of the material 31 may be electroded and then rolled into a cylindrical geometry with an interlayer of insulating paper or the like to prevent contact of the two electrodes. The matrix 32 may alternatively be formulated as a printable vehicle containing polymer and solvent, whereby the dielectric composite material 31 and electrodes 34 may be printed onto a substrate to form a capacitor. This capacitor would not require firing in order to achieve high capacitance because the beads 33 within the material's matrix have already been fired before printing. The dielectric composite material in this case is a prefired ceramic dielectric material. The general principles of printable thick-film formulations are well known in the art, and many suitable polymer/solvent combinations are available. The particular combination chosen for a specific situation will depend on the substrate material, feature size to be printed, and other relevant factors as are well understood by those skilled in the art.

The inventive composite material may also be formulated as a paintlike material for coating selected surfaces to modify their dielectric properties. For these applications, conventional water-based or solvent-based paint vehicles may be used. Alternatively, a more durable coating may be formulated by dispersing the dielectric beads in a thermosetting system such as epoxy or the like, and curing the coating after application. It will be understood that the conformal coating described here may be applied as a single layer or as a plurality of layers, whereby the dielectric properties of the coating may be graded. Successive layers might contain differing bead size, composition, volume fraction, etc. For example, the first (inner) coating might contain barium titanate beads synthesized generally in accordance with EXAMPLE 5 and a second (outer) coating might contain lead titanate beads synthesized generally in accordance with EXAMPLE 7 and having a lower dielectric constant, whereby a graded structure is produced.

It will be further understood that conformal coatings as contemplated herein may additionally contain other functional or inert components such as plasticizers, colorants, light-absorbent pigments, etc. as are well known in the art.

Skilled artisans will appreciate that dielectric spheres as illustrated in FIG. 3 will exhibit the phenomenon of dielectric resonance at predictable frequencies that are a function of diameter and dielectric constant. Thus a composite containing substantially monosized beads will display frequency-dependent properties that might be usefully employed in a filter circuit, for example.

Figure 4:
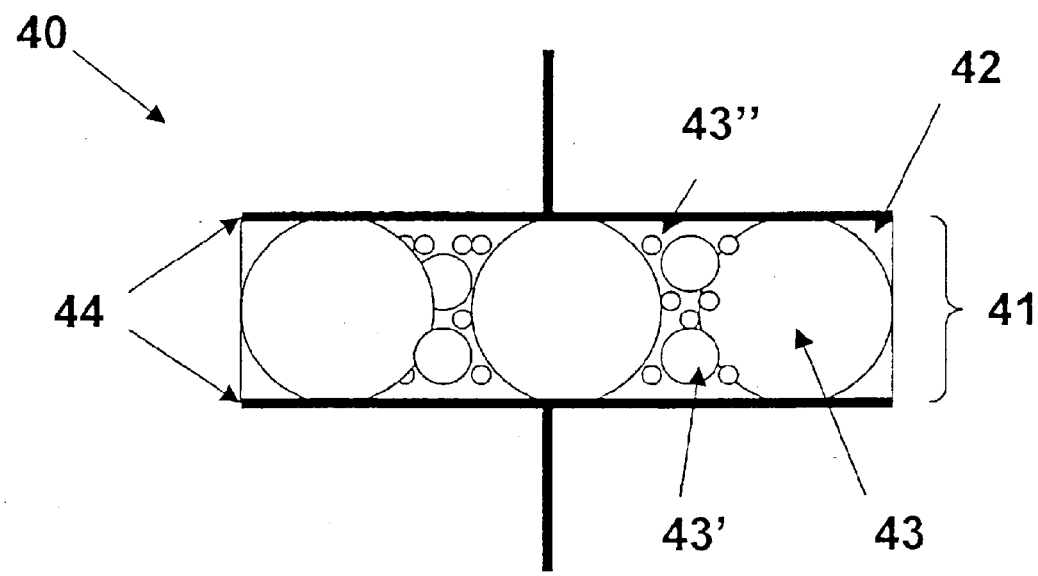
FIG. 4 illustrates a device employing the dielectric beads of the present invention as a mixture of several diameters in order to maximize volumetric packing density of the high dielectric phase.

Shown in FIG. 4 is another useful embodiment of the inventive material to form a capacitor 40 whereby a composite dielectric material 41 comprises a polymeric matrix 42 having a mixture of ceramic beads of various sizes 43, 43', and 43" are arranged between two electrodes 44. The diameters of the beads may be optimally selected to comprise as much as 96% by volume of the composite material 41 while maintaining good workability of the composite. This arrangement is particularly useful in the aforedescribed printable vehicle containing polymer and solvent, whereby a large volume fraction of dielectric beads 43 may be suspended in the vehicle 42 while maintaining good printability.

It is well known that the effective dielectric constant of a ferroelectric material may be increased through the alignment of its domains by a process known as poling. In this process, the material is first heated to a temperature above its Curie point. An electric field is applied to the material and the field is maintained while the material is cooled through the Curie point, thereby aligning the domains.

Figure 5:
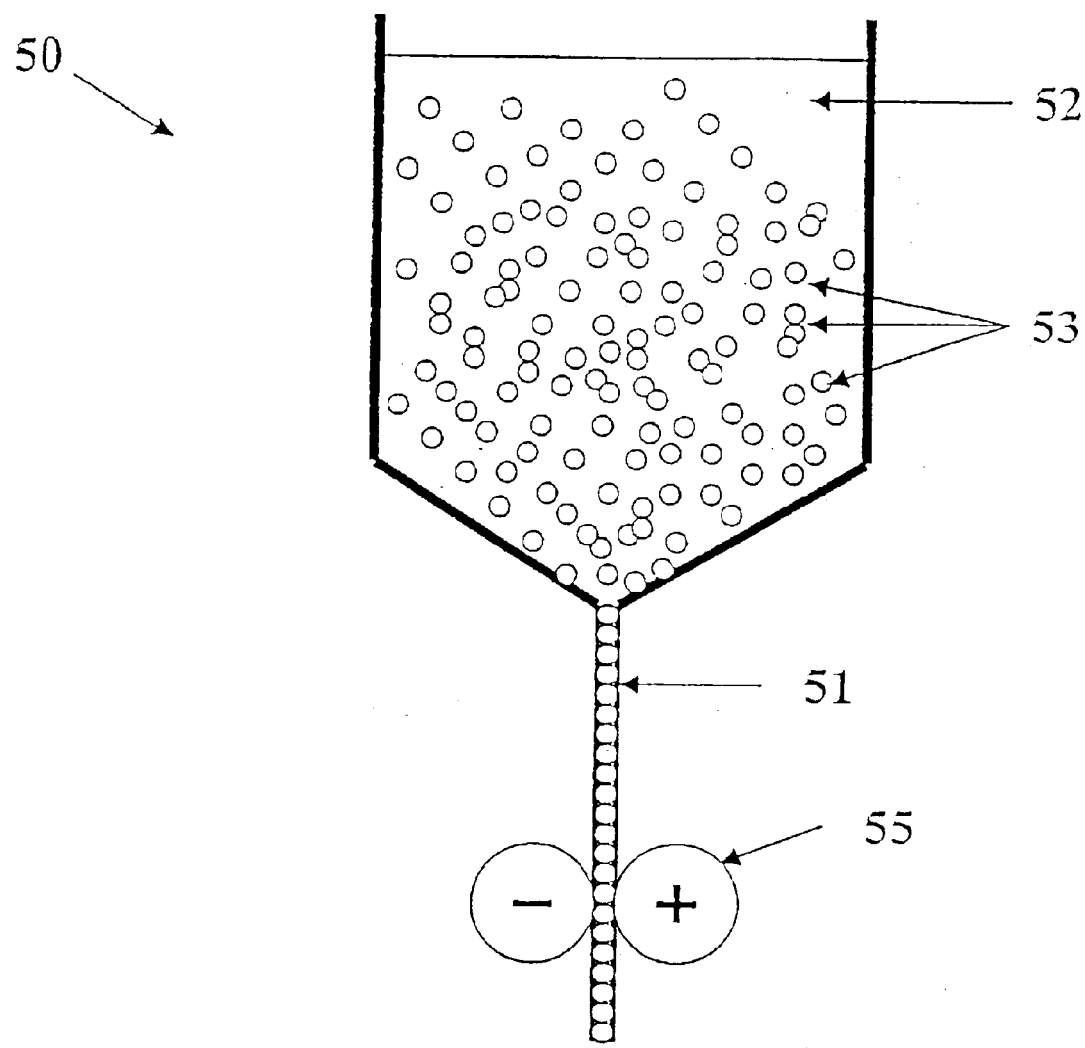
FIG. 5 illustrates one process for poling the inventive dielectric composite in order to increase the effective dielectric constant of the material.

FIG. 5 illustrates one process 50 for poling the inventive dielectric composite in order to increase the effective dielectric constant of the material. In this embodiment, monosized beads 53 are dispersed in a thermoplastic polymer 52 that solidifies at a temperature greater than the Curie point of the beads 53. The resulting composite is extruded into a sheet 51 and an electric field is applied through opposing rollers 55 as the composite 51 cools through the Curie point, thereby poling the beads 53.

Properties of selected polymer materials are summarized in Table 2, where it can be seen that the relative permittivities are very low compared to those of the dielectric ceramics described in the foregoing examples. It can also be seen that many of these polymers have maximum use temperatures well above the Curie points of the dielectrics listed in Table 3. Thus, many material combinations may be selected for a particular application and specifically many of these combinations may be suitable for using the poling technique described above.

TABLE 2

Properties of Selected Polymer Materials

| Polymer | Relative Permittivity, $\epsilon_r$ | Max. Use Temp., °C. |
|---|---|---|
| ABS resins | 2.8–3.2 | |
| Acrylics | 3.5–4.5 | |
| Alkyds | 5.4–6.3 | |
| Cellulose acetate | 3.5–7.5 | 65–93 |
| Cellulose triacetate | | 150–200 |
| Polyvinyl chloride | 3.08 | 70–80 |
| Epoxy resins | 4–5 | |
| PTFE | 2.1 | 260 |
| Polyimide | 3.4 | |
| Nylons | 3.3–9.3 | 150 |
| Polyethylene Type I | 2.25–2.35 | 80 |
| Polyethylene Type II | | 160 |
| Polyethylene Type III | | 120 |
| PET | | 120 |
| Polypropylene | | 135–150 |

TABLE 3

Properties of Selected Ceramic Dielectric Materials

| Composition[a] | Relative Permittivity, $\epsilon_r$ | Curie Temperature, °C. |
|---|---|---|
| $BaTiO_3$ (BT) | | 135 |
| $PbTiO_3$ (PT) | | 492 |
| $SrTiO_3$ (ST) | | −163 |
| 90PZN-10BT | 5800 | 40–85 |
| 80PZN-10BT-10PT | 23,000 | 85–125 |
| 90PMN-10PT | 19,000 | 44 |
| PLZT | 1200–2500 | 125–270 |
| $CaCu_3Ti_4O_{12}$ | 80,000 | >325[b] |

[a]$PZN = Pb(Zn_{0.33}Nb_{0.67})O_3$
$PMN = Pb(Mg_{0.33}Nb_{0.67})O_3$
$PLZT = (Pb,La)(Zr,Ti)O_3$
[b]This material is reported to have a high dielectric constant up to at least 325° C.; its Curie temperature has not been reported to Applicants' knowledge As discussed in the foregoing examples, the dielectric beads of the present invention are preferably substantially dense, sintered, spherical beads (microspheres). It is well known that a well-controlled internal gelation process can produce beads that are spherical to within a few percent or better (major diameter versus minor diameter) and mono-sized to within a few percent (standard deviation of particle diameters). At the same time, skilled artisans will appreciate that in any batch containing a large number of small beads, some beads will exhibit various imperfections. Such imperfections may include cracks, split beads (half beads or other fragments) and misshapen beads. It will be understood, however, that in many instances the contemplated composite materials will tolerate such minor variations because of the averaging effect of the large number of beads in each article or device. On the other hand, for critical applications where a very uniform product is needed, sieves, classifiers, vibrating tables, and other well-known devices may be used to eliminate broken or outsized beads before incorporating the beads into the polymer matrix.

Figure 6:
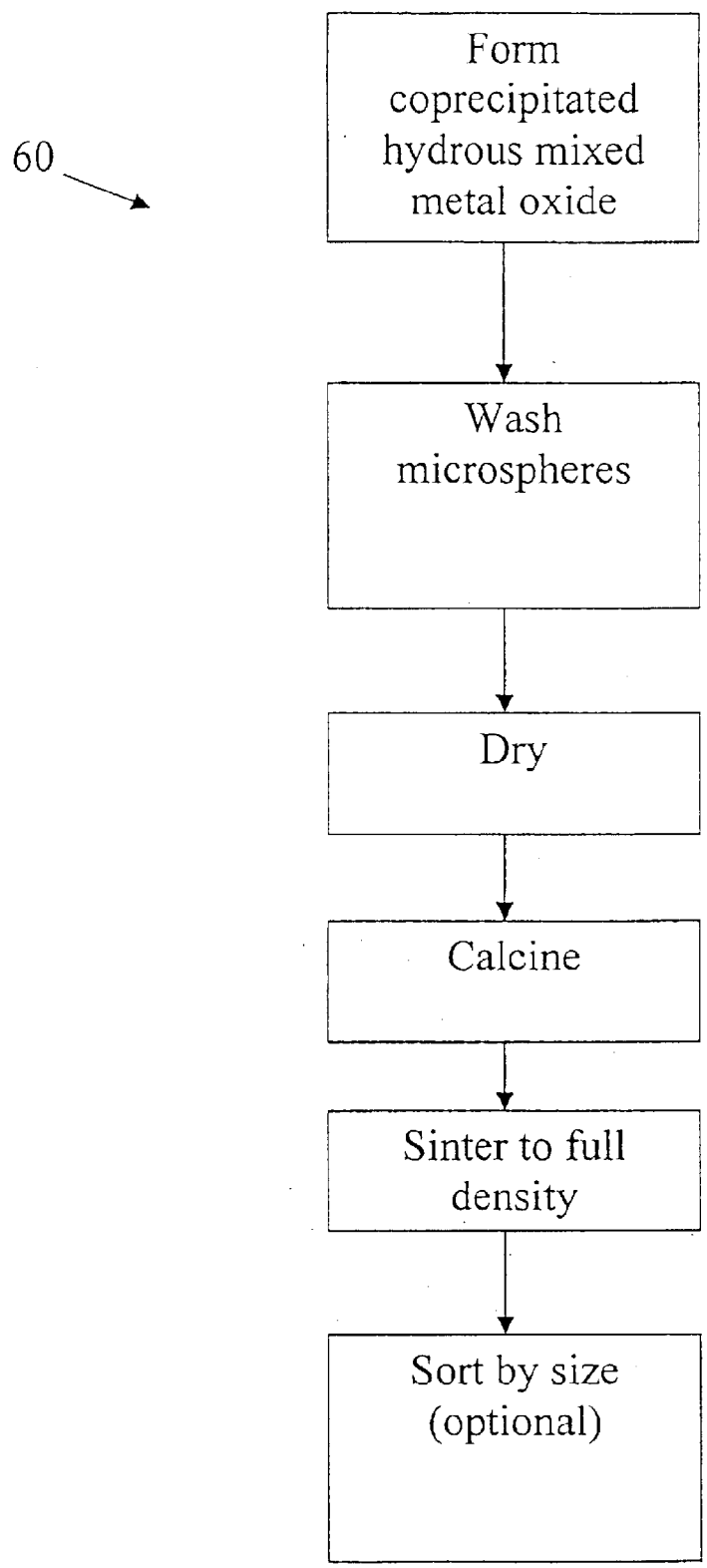
FIG. 6 is a schematic diagram of a coprecipitation process used to make the dielectric beads of the present invention.
Figure 7:
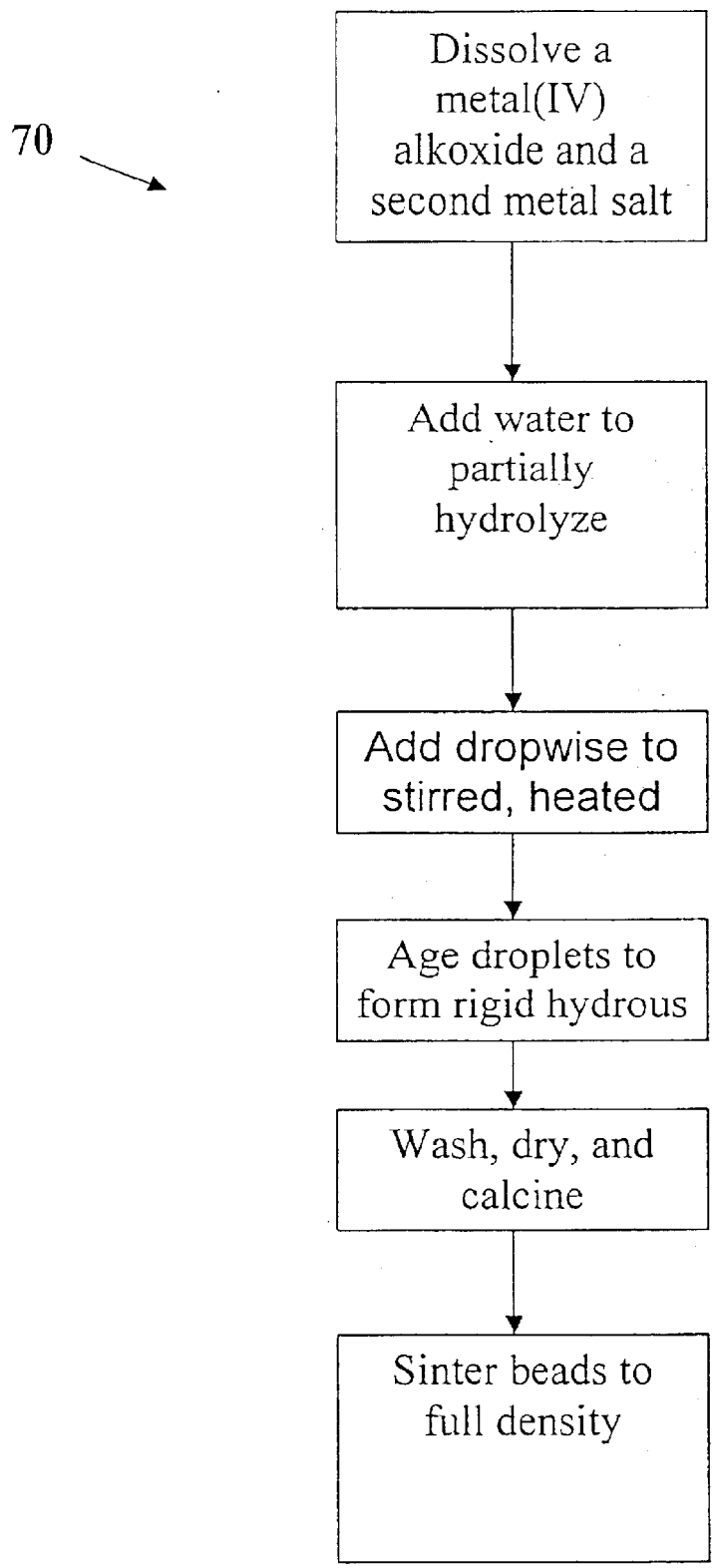
FIG. 7 is a schematic diagram of an alkoxide process used to make the dielectric beads of the present invention.

FIG. 6 illustrates schematically the method of the present invention 60 for making dielectric beads using a coprecipitation process to make the precursor materials. FIG. 7 schematically illustrates the method of the present invention 70 for making dielectric beads using an alkoxide process to make the precursor materials.

As shown in the Figures, many contemplated embodiments of the present invention will comprise generally planar structures. It will be understood, however, that the term "planar" as used herein encompasses not only generally flat sheet-like structures, but also materials that may be formed as a sheet and later rolled into a cylinder, as well as coatings of generally uniform thickness that might be conformal upon a surface that is not necessarily "flat" per se.

It will be further understood that the term "flexible" as used herein describes any structure that may withstand sufficient flexural deformation to perform a particular function. Such flexure might be elastic or might involve some degree of plastic deformation. One example of flexure is the rolling of a flat sheet into a cylinder as described hereinabove. Another example of flexure is the ability of a conformal coating to withstand deflections or vibrations of the underlying substrate without cracking, delaminating, or otherwise failing to adhere and perform as needed.

While several preferred embodiments have been shown and described, and several examples have been specifically delineated, it will be understood that such descriptions are not intended to limit the disclosure, but rather it is intended to cover all modifications and alternate methods falling within the spirit and the scope of the invention as defined in the appended claims or their equivalents.

What is claimed is:

1. A method for making a dielectric composite material comprising the steps of:
   a) forming polycrystalline spherical hydrous metal oxide beads by a sol gel process wherein said beads comprise at least one Group IVb metal species;
   b) calcining said beads to form sinterable, polycrystalline spherical beads;
   c) sintering aid polycrystalline spherical heads to a desired density, a desired grain size, and an average diameter of about 10 μm or larger; and
   d) dispersing said polycrystalline beads in a polymer matrix to form a dielectric composite material.

2. The method of claim 1 wherein said beads comprise metal oxides, mixed meal oxides, titanates, niobates, zirconates or a combination thereof.

3. The method of claim 2 wherein said beads comprise barium titanate or modifications thereof.

4. The method of claim 2 wherein said beads comprise lead perovskites.

5. The method of claim 1 wherein said beads comprise rare-earth perovskites.

6. The method of claim 1 wherein said sol gel process comprises an internal gelation process, an external gelation process, a water extraction process or an alkoxide process.

7. The method of claim 1 wherein hydrous titanium oxide gel beads are formed in step a), then said method further comprising the step of hydrothermally reacting said beads with one or more metal ions under hydrothermal conditions prior to step b).

8. The method of claim 1 further comprising the steps of heating said dielectric composite material to a temperature above the Curie point of said spherical beads then applying an electric field to said composite material while cooling said composite material below the Curio point thereby poling said spherical beads.

9. A method for making an electrical capacitor comprising the steps of:
   a) forming polycrystalline spherical hydrous metal oxide beads by a sol gel process wherein said beads comprise at least one Group IVb metal species;

b) calcining said beads to form sinterable, polycrystalline spherical beads;

e) sintering said polycrystalline spherical beads to a desired density and, a desired grain size, and an average diameter of about 10 µm or larger; and d) dispersing said polycrystalline beads in a polymer matrix to form a planar dielectric composite material; and, e) applying electrodes to opposite surfaces of said dielectric composite material.

10. The method of claim 9 wherein said beads comprise metal oxides, mixed metal oxides, titanates, niobates, zirconates or a combination thereof.

11. The method of claim 10 wherein said beds comprise barium titanate or modifications thereof.

12. The method of claim 10 wherein said beads comprise rare-earth perovskites.

13. The method of claim 10 wherein said beads comprise lead perovskites.

14. The method of claim 9 wherein said sol gel process comprises an internal gelation process, an external gelation process, a water extraction process or an alkoxide process.

15. The method of claim 9 wherein hydrous metal oxide gel beads are formed in step a), then said method further comprising the step of hydrothermally reacting said beads with at least one other metal ion under hydrothermal conditions prior to step b).

16. The method of claim 9 further comprising the steps of heating said dielectric composite material to a temperature above the Curie point of said spherical beads then applying an electric field to said dielectric composite material while cooling said composite dielectric material below the Curie point thereby poling said spherical beads.

* * * * *